United States Patent [19]
Tani

[11] Patent Number: 5,157,628
[45] Date of Patent: Oct. 20, 1992

[54] SEMICONDUCTOR MEMORY

[75] Inventor: Kazuhiko Tani, Kanagawa, Japan

[73] Assignee: Sony Corporation, Tokyo, Japan

[21] Appl. No.: 565,135

[22] Filed: Aug. 10, 1990

[30] Foreign Application Priority Data

Aug. 11, 1989 [JP] Japan .................. 1-208572

[51] Int. Cl.$^5$ .......................... G11C 7/00
[52] U.S. Cl. .................. 365/200; 365/230.03; 371/10.2
[58] Field of Search .................. 365/200, 230.03; 371/10.2

[56] References Cited

U.S. PATENT DOCUMENTS

| | | | |
|---|---|---|---|
| 4,757,474 | 7/1988 | Fukushi et al. ............ | 365/200 |
| 4,885,721 | 12/1989 | Katanosaka ............... | 371/10.2 |
| 4,890,262 | 12/1989 | Hashimoto et al. ......... | 365/200 |
| 4,905,192 | 2/1990 | Nogami et al. ............ | 365/200 |

FOREIGN PATENT DOCUMENTS 0178948 4/1986 European Pat. Off. .
0300467 1/1989 European Pat. Off. .

*Primary Examiner*—Joseph E. Clawson, Jr.
*Attorney, Agent, or Firm*—Hill, Van Santen, Steadman & Simpson

[57] ABSTRACT

A semiconductor memory in which a normal memory area is divided into a plurality of divided memory areas, a data buffer is provided for each of the divided memory areas, the bit lines of each divided memory area is connected via column selector to a data buffer corresponding to the divided memory area, a buffer changeover switching means is connected between each data buffer and the data bus, a column accessing is made by turning the buffer changeover switching means in a predetermined sequence while said column selector is controlling by output signals of the column decoder decoding the column address signals, is disclosed.

The above mentioned semiconductor memory is so designed that, for rescuing the bit in trouble without uselessly increasing the area, a redundancy memory area and a redundancy data buffer are provided which are connected via the redundancy select switching means, said redundancy select switching means is turned on by an address comparator circuit when the column address in trouble coincides with the column address signal, and that the redundancy data buffer is connected to the data bus when the buffer changeover switching means connected to the data buffer corresponding to the divided memory area containing the bit in trouble in turned on and the redundancy select switching means is turned on, with the normal memory area side being further disconnected from the data bus at least during the reading operation.

3 Claims, 3 Drawing Sheets

SEMICONDUCTOR MEMORY

BACKGROUND OF THE INVENTION

1. Field of the Invention

This invention provides a semiconductor memory in which a normal memory area is divided into a plurality of divided memory areas, a data buffer is provided for each of the divided memory areas, the bit lines of each divided memory area is connected via column selector to a data buffer corresponding to the divided memory area, a buffer changeover switching means are connected between each data buffer and the data bus, a a column accessing is made by turning the buffer changeover switching means in a predetermined sequence while said column selector is controlled by output signals of the column decoder decoding the column address signals.

2. Prior Art

FIG. 2 shows an example of a semiconductor memory. In distinction from the ordinary random access memory (RAM) which may be accessed in random, this semiconductor memory is adapted to write or read signals in a predetermined sequence, and has been evolved as a video signal processing memory.

In the drawing, 1 is a memory area having m pairs of column lines, m being a positive integer. The memory area is divided into p divided memory areas $2_1, 2_2, \ldots, 2_p$, p being equal to m/n, n being a positive integer smaller than m. Each divided memory area has n pairs of column lines.

$3_1, 3_2, \ldots, 3_p$ are column selectors provided in association with the divided memory areas $2_1, 2_2, \ldots, 2_p$ for connecting a bit line pair among n pairs of bit lines of the divided memory areas 2 designated by the output of the column decoder 4. The data buffers $5_1, 5_2, \ldots, 5_p$ are provided in association with the divided memory areas $2_1, 2_2, \ldots, 2_p$, and connected to the divided memory areas $2_1, 2_2, \ldots, 2_p$ corresponding thereto by way of the column selectors $3_1, 3_2, \ldots, 3_p$.

$Q_{b1}, Q_{b2}, \ldots, Q_{bp}$ are buffer changeover switching transistors connected between the data buffers $5_1, 5_2, \ldots, 5_p$ and the data bus 6, and switched by driving circuits $7_1, 7_2, \ldots, 7_p$. The driving circuits $7_1, 7_2, \ldots, 7_p$ are connected in tandem and turn on the data buffers $5_1, 5_2, \ldots$ for a certain time at a predetermined sequence. Thus they serve for sequentially connecting data buffers $5_1, 5_2 \ldots$ to data bus 6.

The operation is hereinafter explained. First explaining the reading operation, a pair of the lines of each divided memory area 2 is connected by an output signal of column decoder 4 to a data buffer 5 via column selector 3 and the signal stored in the memory cell is transferred to and stored in data buffer 5. The column address signal is switched and the output signal of the column decoder 4 is switched therewith so that the signal from the next bit line pair is transferred to and stored in data buffer 5. This operation is repeated sequentially until n signals are stored in data buffer 5. The data buffer 5 connected to data bus 6 by one driving circuit 7 outputs n signals sequentially. On termination of signal reading at one divided memory area 2, reading is performed at the next divided memory area 2. In this manner, reading is performed in all of the divided memory areas 2 in a predetermined sequence.

The writing operation is hereinafter explained. Input data signals are input from data bus 6 sequentially. These input data signals are sequentially fetched by one data buffer 5 selected by one driving circuit 7 and, when the number of bits of the signal reaches n, the input data signals are written via column selector 3 into divided memory area 2. After this operation is repeated p times, data are written in the memory cells connecting to all of the bit lines.

The reason the data buffer is not provided for each bit line pair but one data buffer is provided for each of plural pairs of bit lines in the semiconductor memory is to avoid increase in the occupied area.

The above semiconductor memory has one data bus. However, plural data buses may also be provided. FIG. 3 shows the provision of q data buses.

With the above semiconductor memory, reading is performed by forming sequential data by repeating the operation of loading q data of n data signals on the data bus in parallel and performing parallel series conversion n/q number of times.

For writing, input data signals sequentially input are converted into q parallel data, these q parallel data being simultaneously transferred to data buffers $5_1, 5_2, \ldots, 5_p$. In this case, the drive circuits $7_1, 7_2, \ldots, 7_q$ turn on the buffer switching $Q_{b1}, Q_{b2}, \ldots, Q_{bq}$ simultaneously.

After the transfer operations are repeated n/q number of times, and when the n data signals are prepared at the data buffer 5, they are transferred via column selectors $3_1, 3_2, \ldots, 3_q$ to bit line pairs the divided memory areas $2_1, 2_2, \ldots, 2_q$. This operation is repeated m/n number of times so that data can be written in the selected memory cells connecting to the column lines.

Meanwhile, in a semiconductor memory of the type shown in FIGS. 2 and 3, when there is a trouble in the memory cell by providing a redundant memory area as in the technology described in the Japanese Patent Publication No. 63-29360, it is necessary to increase the substantial production yield by using a redundant memory area in place of the bit in trouble.

However, although the technology of the Japanese Patent Publication No. 63-29360 is effective for the ordinary random access memory RAM, it cannot be applied to a semiconductor memory of the type in which the redundant memory area is divided into plural divided memory areas, data buffers are provided in association with the divided memory areas, column selectors are interposed and accessed in a predetermined sequence by the intermediary of column selectors controlled by a column decoder 4 between the divided memory area and the data buffer by the following reason.

Since the output line of the column decoder 4 is input to plural column selectors $3_1, 3_2, \ldots, 3_p$ in such semiconductor memory, when switching to a redundant memory area as to one bit line in trouble, it is necessary that the signal of the bit line in trouble be not transferred to the data buffer. A method devised to meet such necessity is to inactivate the signal among the output signals of the column decoder 4 which designates the column address including the bit in trouble. However, in such case, the bit line pairs belonging to other divided memory areas are also inactivated as long as they correspond to the same column address so that an ordinary operation cannot be expected. Thus this method cannot be resorted to.

It is also contemplated to make substitution by the redundant memory area with the totality of bit line pairs selected by the output line of the column decoder 4 selecting the bit line in trouble. However, in such case, the area of the redundant memory area is uselessly increased. For this reason, in the semiconductor memory of the type shown in FIGS. 2 and 3, the technology of rescuing the column in trouble by the redundant memory area has not been used.

OBJECT AND SUMMARY OF THE INVENTION

The present invention is made for solving the above problem and provides a semiconductor memory in which a normal memory area is divided into a plurality of divided memory areas, a data buffer is provided for each of the divided memory areas, the bit lines of each divided memory area is connected via column selector to a data buffer corresponding to the divided memory area, a buffer changeover switching means is connected between each data buffer and the data bus, a column accessing is made by turning the buffer changeover switching means in a predetermined sequence while said column selector is controlled by output signals of the column decoder decoding the column address signals wherein the bit in trouble may be rescued without uselessly increasing the area.

For solving the above problem, the semiconductor memory of the present invention is characterized in that a redundant memory area and a redundant data buffer connected via redundancy select switching means are provided, the redundancy select switching means are turned on by an address comparator circuit when the column address in trouble coincides with the column address signal and, when the buffer switching means connected to the data buffer associated with the divided memory area where there is a bit in trouble is turned on and the redundancy select switching means is turned on, the redundant data buffer is connected to the data bus and, at least during reading, the regular memory area side is further disconnected from the data bus.

With the semiconductor memory of the present invention, when the bit line in trouble is accessed, the redundant memory area is activated after the redundant data buffer is connected to the data bus while the regular memory area side is connected from the data bus, so that the bit line in trouble may be replaced by the redundant memory area. Thus the replacement by the redundant memory area of the bit in trouble may be performed without hindrance without inactivating an output line selecting a bit line in trouble among the column decoder output lines. There is of course no necessity of providing redundant memory area, while being not in trouble, for many other bit lines selected by the output lines of the column data selecting the bit line in trouble.

Thus the bit in trouble can be rescued without uselessly increasing the area.

DETAILED DESCRIPTION OF THE PREFERRED EMBODIMENT

Figure 1:
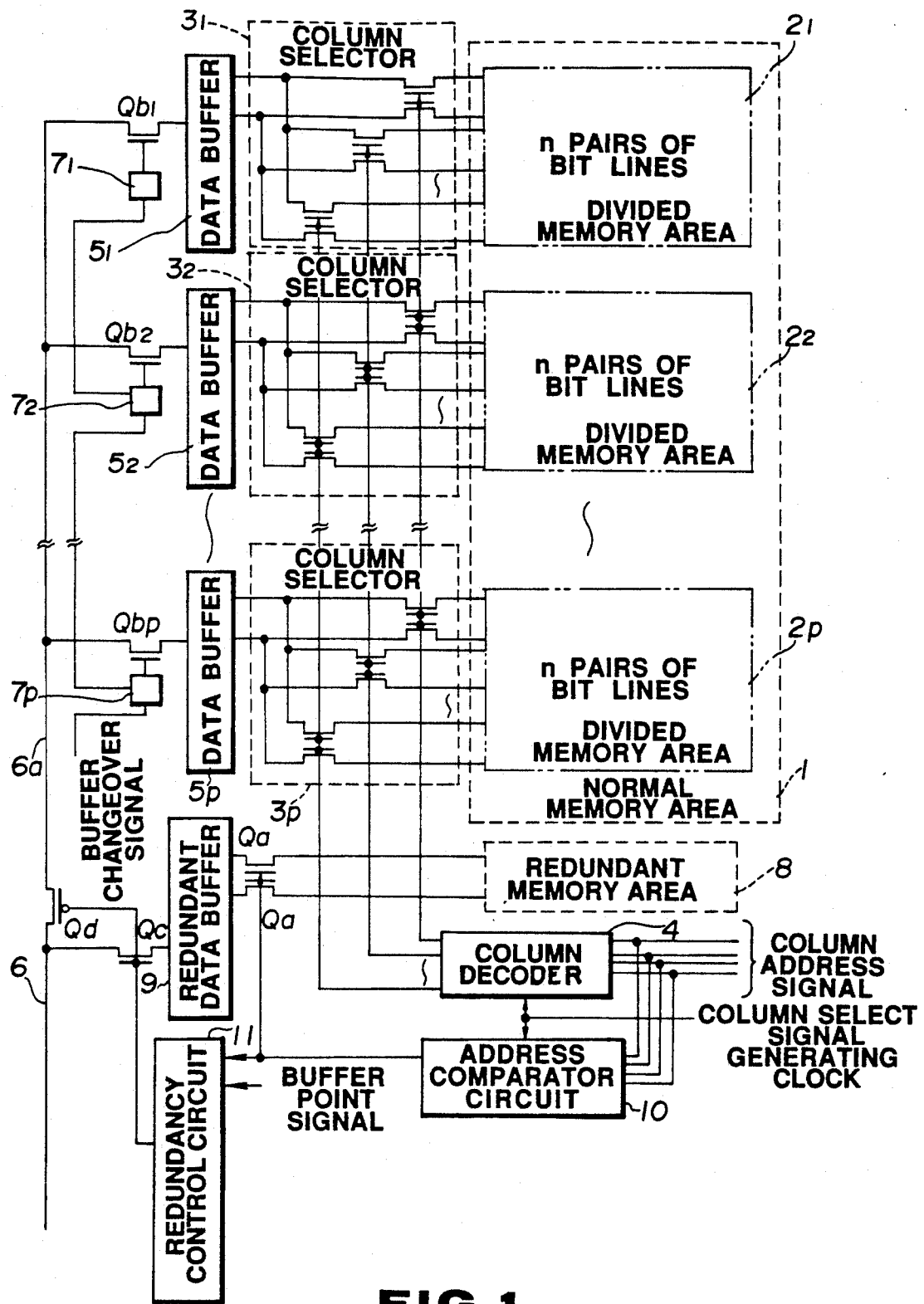
FIG. 1 is a circuit block diagram showing an embodiment of a semiconductor memory of the present invention.

An embodiment of the semiconductor memory of the present invention is explained in detail by referring to the drawings.

FIG. 1 is a circuit block diagram showing an embodiment of the semiconductor buffer memory of the present invention.

In the drawing, 1 is a memory area having m pairs of column lines, m being a positive integer. The memory area is divided into p divided memory areas $2_1, 2_2, \ldots, 2_p$, p being equal to m/n, n being a positive integer smaller than m. Each divided memory area has n pairs of column lines.

$3_1, 3_2, \ldots, 3_p$ are column selectors provided in association with the divided memory areas $2_1, 2_2, \ldots, 2_p$ for connecting a bit line pair among n pairs of bit lines of the divided memory areas 2 designated by the output of the column decoder 4. The data buffers $5_1, 5_2, \ldots, 5_p$ are provided in association with the divided memory areas $2_1, 2_2, \ldots, 2_p$, and connected to the divided memory areas $2_1, 2_2, \ldots, 2_p$ corresponding thereto by way of the column selectors $3_1, 3_2, \ldots, 3_p$.

$Q_{b1}, Q_{b2}, \ldots, Q_{bp}$ are buffer changeover switching transistors connected between the data buffers $5_1, 5_2, \ldots, 5_p$ and the data bus 6, and switched by driving circuits $7_1, 7_2, \ldots, 7_p$. The driving circuits $7_1, 7_2, \ldots, 7_p$ are connected in tandem and turn on the data buffers 5, 5, ... for certain time at a predetermined sequence. Thus they serve for sequentially connecting data buffers 5, 5 ... to data bus 6.

In FIG. 1, 8 is a redundant memory area, with the number of the bit line pair being 1. 9 is a redundant data buffer provided in association with the redundant memory area 8. A pair of redundancy select transistors $Q_a$, $Q_b$ are connected between the bit line pair of the redundant memory area 8 and the redundant data buffer 9.

$Q_c$ is a redundant data buffer switching transistor connected between the redundant data buffer 9 and the data bus 6 and $Q_d$ is a bus separation transistor for separating the normal memory area side portion $6_a$ of the data bus from the proximal side of the data bus by being turned off. $Q_a$ to $Q_c$ are n-channel MOS transistors, whereas $Q_d$ is a p-channel MOS transistor, 10 is an address comparator having enclosed therein memory means for storing column addresses of the bit in trouble and comparator means for comparing the column address of the bit in trouble and the column address signal input to the column decoder 4 and, when a coincidence signal is produced as result of comparison, a coincidence signal is output as control signal to the redundancy select transistors $Q_a$, $Q_a$ to turn the transistors off.

11 is a redundancy control circuit receiving a buffer point signal indicating which buffer switching $Q_b$ connected to the data buffer 5 is on and an output signal of the address comparator 10 to control the redundant data buffer switching transistor $Q_c$ and bus segregating transistor $Q_d$. More specifically, it outputs a driving signal when the buffer switching transistor $Q_b$ connected to the data buffer 5 associated with the split memory area of the bit in trouble is on and the coincidence output is being supplied from the address comparator 10 to turn the normally off redundant data buffer switching transistor $Q_c$ on while turning the normally on bus segregating transistor $Q_d$ off.

Figure 2:
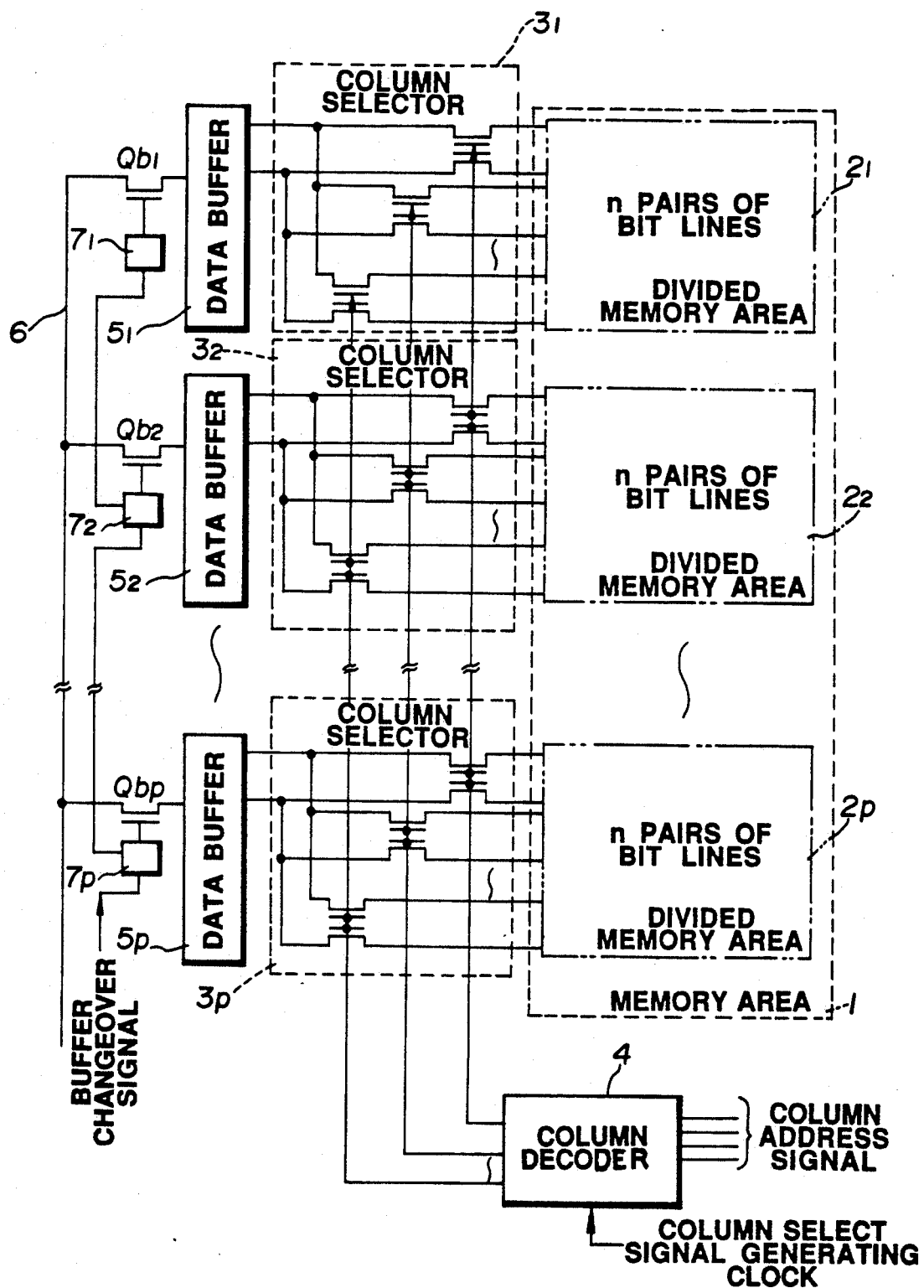
FIG. 2 is a circuit block diagram showing a conventional example.
Figure 3:
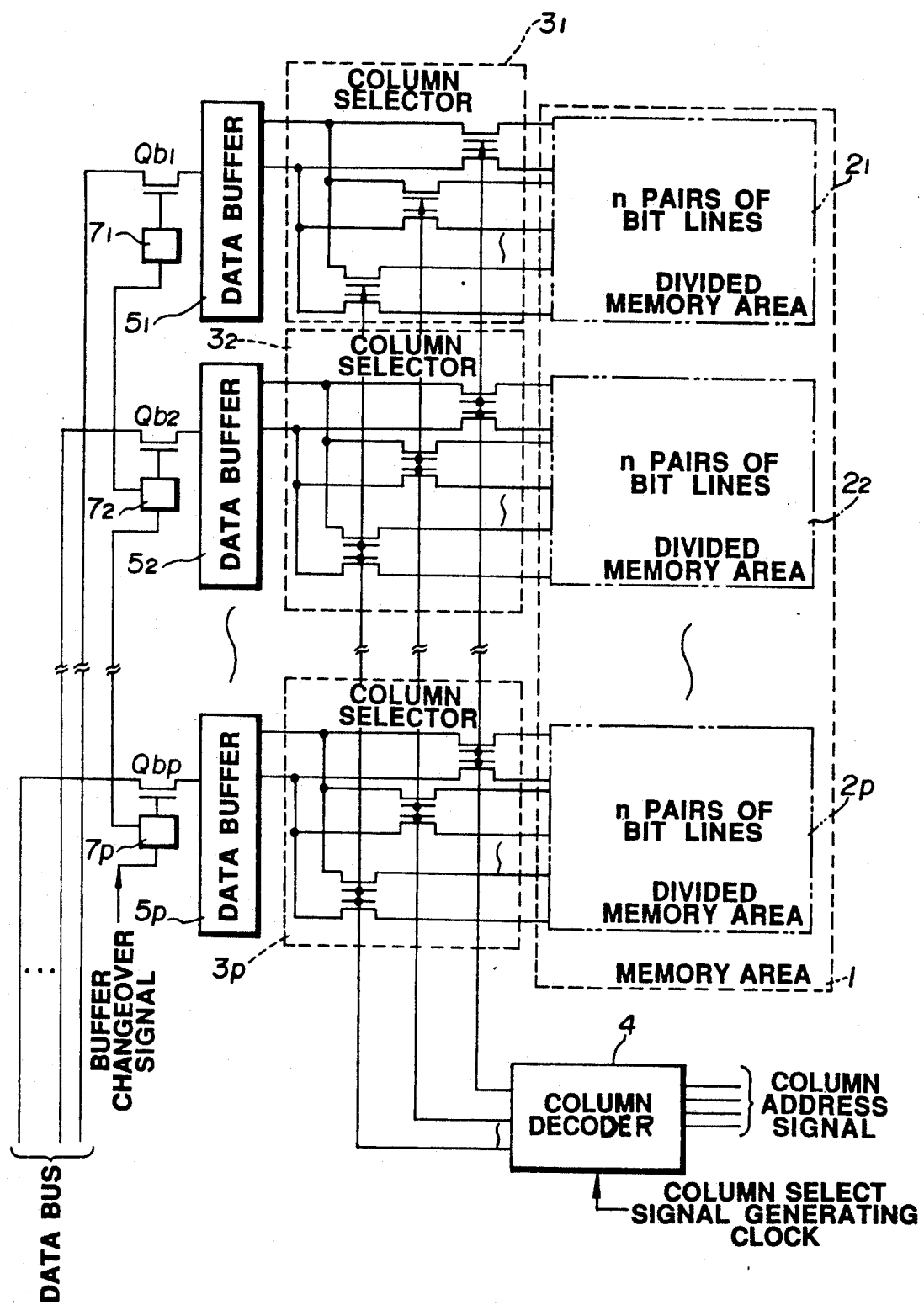
FIG. 3 is a circuit block diagram showing another conventional example.

The operation is hereinafter explained. The bus segregating transistor $Q_d$ is normally on, and the redundant data buffer switching $Q_c$ is off, and the contents of the operation are not basically changed from those of the semiconductor memory shown in FIG. 2. That is, the operation when the normal bit in the regular memory area 1 is accessed is not basically different between the present semiconductor memory and the conventional semiconductor memory.

First explaining the normal reading operation, a pair of the lines of each divided memory area 2 is connected by an output signal of column decoder 4 to a data buffer 5 via column selector 3 and the signal stored in the memory cell is transferred to and stored in data buffer 5. The column address signal is switched and the output signal of the column decoder 4 is switched therewith so that the signal from the next bit line pair is transferred to and stored in data buffer 5. This operation is repeated sequentially until n signals are stored in data buffer 5. The data buffer 5 connected to data bus 6 by one driving circuit 7 outputs n signals sequentially. On termination of signal reading at one divided memory area 2, reading is performed at the next divided memory area 2. In this manner, reading is performed in all of the divided memory areas 2 in a predetermined sequence.

The normal writing operation is hereinafter explained. Input data signals are input from data bus 6 sequentially. These input data signals are sequentially fetched by one data buffer 5 selected by one driving circuit 7 and, when the number of bits of the signal reaches n, the input data signals are written via column selector 3 into divided memory area 2. After this operation is repeated p times, data are written in the memory cells connecting to all of the bit lines.

The operation when the malfunctioning bit is accessed, that is when the redundant memory area is to come into operation, is explained.

When the malfunctioning bit is accessed, a coincidence signal is output from the address comparator circuit 10. It is because the column address signal input to the column decoder 4 and the column address of the malfunctioning bit necessarily coincide when the malfunctioning bit is accessed. By this coincidence signal, the redundancy select transistors $Q_a$, $Q_a$ are turned on.

A driving signal is output from the redundancy control circuit 11 when the malfunctioning bit is accessed. It is because the redundancy control circuit 11 is at a position to determine by the buffer point signal if the buffer switching transistor $Q_b$ connected to the data buffer 3 corresponding to the split memory area 2 associated with the malfunctioning bit is on, and has the function of outputting an output signal when the coincidence signal is produced from the address comparator circuit 10 when the buffer switching transistor $Q_b$ is on. It is by this driving signal that the redundant data buffer switching transistor $Q_c$ is turned on and the bus segregation transistor $Q_d$ is turned off.

As a result, the redundant memory area 8 is connected via transistor $Q_a$, $Q_a$ to the redundant data buffer 9 via transistors $Q_a$, $Q_b$, while the redundant data buffer 9 and the data bus 6 are connected via transistor $Q_c$ so that reading can be made from redundant memory area 8 or writing can be made into redundant memory area 8. Since the portion 6a of the regular memory area side of the data bus 6 is segregated from the proximal side of the data bus 6 by the bus segregating transistor $Q_d$ which is turned off, the situation of simultaneous operation of the bit in trouble and the redundant memory area 8 may be avoided. This avoidance is crucial when reading signals since otherwise the signal from the malfunctioning bit and the redundant memory area may be mixed together.

It is however not always necessary to turn off the bus segregating transistor $Q_d$ when writing data signals. It is because, even if the data signals are written into both the redundant memory area and the bit in trouble, the malfunctioning bit may be compensated without any hindrance if reading is made only from the redundant memory area during reading.

Although one data bus 6 is used in the semiconductor memory of the present embodiment, the semiconductor memory of the present invention may be applied to the case of plural data buses 6. In this case, the numbers of the redundant memory areas 8, redundant data buffers 9, address comparator circuits 10, redundancy control circuits 11, redundancy select transistors $Q_a$, $Q_a$, redundant data buffer switching $Q_c$ and bus segregating transistor of the redundancy circuit equal to the number of data buses.

What is claimed is:

1. A semiconductor memory in which a normal memory area is divided into a plurality of divided memory areas for storing data bits, comprising, in combination;
    a data buffer provided for each of the divided memory areas,
    the bit lines of each divided memory area being connected via a column selector to a data buffer corresponding to the divided memory area,
    a buffer changeover switching means connected between each data buffer and the data bus,
    a column accessing is made by turning on said buffer changeover switching means in a predetermined sequence while said column selector is controlled by output signals of a single column decoder decoding the column address signals,
    characterized in that said semiconductor memory comprises a redundant memory area for replacing the divided memory area of said normal memory area for a selected bit,
    a redundant data buffer,
    redundancy selecting switching means connected between said redundant memory area and said redundant data buffer,
    redundant data buffer changeover switching means connected between said redundant data buffer and said data bus,
    bus separating switching means for separating portions corresponding to the normal memory at least during reading,
    an address comparator circuit for storing the column address of said selected bit and turning said redundancy selecting switching means on when said address and said column address signal coincide with each other, and
    a redundancy control circuit for turning on said redundant data buffer changeover switching means when the data buffer changeover switching means connected to the data buffer corresponding to the divided memory area of said selected bit is on and the redundancy selecting switching means is on, said control circuit turning said bus separating switching means off and operating said buffer changeover switching means while said column selector is controlled by output signals of said single column decoder decoding the column address signals.

2. A semiconductor memory according to claim 1, wherein each data buffer is connected to one data bus.

3. A semiconductor memory according to claim 1, wherein a common signal is provided to the redundant data buffer changeover switching means and the bus separating switching means by the redundancy control circuit, and these switching means are MOS transistors each having an opposite conductivity type channel, respectively.

* * * * *